United States Patent [19]

Schoenberg et al.

[11] Patent Number: 4,642,321
[45] Date of Patent: Feb. 10, 1987

[54] HEAT ACTIVATABLE ADHESIVE FOR WIRE SCRIBED CIRCUITS

[75] Inventors: Andrew J. Schoenberg, Huntington; Marju L. Friedrich, Babylon, both of N.Y.

[73] Assignee: Kollmorgen Technologies Corporation, Dallas, Tex.

[21] Appl. No.: 757,026

[22] Filed: Jul. 19, 1985

[51] Int. Cl.$^4$ ............................................. C08L 63/00
[52] U.S. Cl. .................................. 523/400; 523/424; 525/438; 525/445; 525/531; 525/528; 525/455; 525/397; 524/423; 524/425; 524/420; 524/432; 524/430; 524/437
[58] Field of Search ............... 525/438, 445, 531, 528, 525/455, 397; 523/400, 424; 524/423, 425, 420, 432, 430, 437

[56] References Cited

U.S. PATENT DOCUMENTS

| | | | |
|---|---|---|---|
| 3,475,200 | 10/1969 | Recker et al. | 117/94 |
| 3,578,622 | 5/1971 | McGrath | 260/338 |
| 3,646,572 | 2/1972 | Burr | 174/68.5 |
| 3,674,602 | 7/1972 | Keogh et al. | 156/380 |
| 3,674,914 | 7/1972 | Burr | 174/68.5 |
| 3,723,568 | 3/1973 | Hoeschele | 260/47 |
| 4,029,626 | 6/1977 | Gillemot et al. | 260/31.6 |
| 4,068,086 | 1/1978 | Dalibor | 560/169 |
| 4,093,675 | 6/1978 | Schure et al. | 156/332 |
| 4,097,684 | 6/1978 | Burr | 174/68.5 |
| 4,116,937 | 9/1978 | Jones et al. | 528/170 |
| 4,137,364 | 1/1979 | Ball et al. | 428/412 |
| 4,151,319 | 4/1979 | McGrath | 428/40 |
| 4,194,618 | 3/1980 | Norton | 206/205 |
| 4,217,437 | 8/1980 | Schreckenberg et al. | 528/171 |
| 4,251,427 | 2/1981 | Recker et al. | 528/48 |
| 4,251,428 | 2/1981 | Recker et al. | 525/424 |
| 4,385,141 | 5/1983 | Agarwal et al. | 524/66 |
| 4,400,497 | 8/1983 | Blum et al. | 528/45 |
| 4,430,479 | 2/1984 | Merton et al. | 525/127 |
| 4,476,259 | 10/1984 | Kordomenos | 528/45 |
| 4,495,240 | 1/1985 | McCarthy | 428/319.1 |
| 4,507,456 | 3/1985 | Blum et al. | 528/45 |

FOREIGN PATENT DOCUMENTS 1237936 6/1959 France .
1504252 3/1978 United Kingdom .

OTHER PUBLICATIONS

Frisch, "Fundamental Chemistry and Catalysis of Polyurethanes," *Polyurethane Technology*, Bruins, editor (Interscience Publishers, NY 1969), pp. 11-13.

*Primary Examiner*—Melvyn I. Marquis
*Attorney, Agent, or Firm*—Morgan & Finnegan

[57] ABSTRACT

A non-blocking, solid, adhesive composition comprising, (a) a film forming polymeric resin of average molecular weight between 10,000 and about 100,000 and having an epoxide, hydroxyl or unsaturated functionality greater than about 2, the polymeric resin being selected from the group consisting of polyesters, polyurethanes and epoxies; (b) at least one filler, or at least one polyfunctional compound of average molecular weight below about 7,000 and containing a polyaromatic backbone, or mixtures thereof, the weight ratio of (a) to (b) being between about 1.5:1 and about 9:1; and (c) a curing agent which is capable of cross-linking and curing the polymeric resin to a C-stage, the curing agent being present in an amount sufficient to C-stage the polymeric resin. The adhesive composition can be activated without becoming C-staged upon application of sufficient heat or ultrasonic energy for a time period less than one second. The curing agent is non-reactive at the conditions which will activate the adhesive composition, but can be made reactive upon application of sufficient energy in the form of radiant energy or in the form of heat at or above the activation temperature, for a time period sufficient to cure the composition. The adhesive composition is flexible, and in the C-stage, is capable of forming an infusible composition which does not melt, flow or decompose when exposed for 10 seconds to molten solder at 260° C. and does not soften when exposed to dichloromethane at 25° C. for one minute. The adhesive composition is suitable for bonding a wire to a surface, to another wire or to itself.

11 Claims, No Drawings 4,642,321

HEAT ACTIVATABLE ADHESIVE FOR WIRE SCRIBED CIRCUITS

BACKGROUND OF THE INVENTION

1. Field of the Invention

This invention relates to an adhesive coating composition which can be heat activated without becoming C-staged, and later can be C-staged. More particularly, this invention relates to an adhesive coating composition which: (1) is non-blocking; (2) can be heat activated without becoming C-staged; (3) later can be C-staged; and (4) is suitable for bonding a wire to a surface, to another wire, or to itself.

2. Description of Prior Art

Heat activatable adhesive compositions can be applied to a substrate as a thin, non-tacky film, can be heat activated and when activated, become and remain tacky for a period of time after activation. Most heat activated thermoplastic adhesives resolidify rapidly upon cooling and have a short open time, i.e., after activation of the adhesive, the adhesive remains aggressively tacky and bondable below the activation temperature for only a short time. Bonding operations must be carried out quickly.

In many bonding operations, it is necessary to employ adhesive compositions which result in adhesive bonds exhibiting resistance to elevated temperatures. It is known that improved temperature resistance of adhesive compositions can be achieved by the incorporation of crosslinking into the compositions. Particular crosslinking agents known in the art include the polyepoxides and optional epoxy polymerization catalysts described in U.S. Pat. No. 3,723,568 to Hoeschele wherein crosslinking is achieved by reactions with available sites in the base polymers.

U.S. Pat. No. 4,137,364 to Ball et al. describes crosslinking of an ethylene/vinyl acetate/vinyl alcohol terpolymer using isophthaloyol biscaprolactam or vinyl triethoxy silane. Crosslinking here is achieved before heat activation, but a higher level of performance is attained by additional crosslinking induced by a heat cure after application of the adhesive. Another example of thermal crosslinking is the polyamino bis maleimide class of flexible polyimides described in U.S. Pat. No. 4,116,937 to Jones et al. These compositions can be hot melt extruded up to 300° F. and undergo crosslinking at temperatures above 300° F. In both of these examples of thermal crosslinking, crosslinking is achieved by reactions of the particular crosslinking agent with available sites of the base polymers.

Thermosetting adhesive compositions are known which combine polyisocyanates with binders which contain groups that are reactive toward isocyanate groups. However, considerable difficulties result from the fact that the isocyanate group reacts with the envisaged reactant, e.g., a polyol or a polyamine, at as low as room temperature. As a result, it is extremely difficult to formulate a combination having a long shelf life.

In order to overcome this difficulty, two-component systems are frequently used. The reactants are stored in separate formulations, which are mixed only just before application; the reaction then takes place spontaneously or is accelerated by heat and/or a catalyst.

For example, such a two component system is described in U.S. Pat. No. 4,029,626. Disadvantages of this system are the necessity for separate formulation and storage of the two components, the difficulties in precise metering and thorough mixing before application, and the danger of blockage of the mixing apparatus and applicator as a result of premature reaction.

Another conventional method of preparing polyisocyanate materials having a long shelf life starts from non-crosslinked prepolymers which contain only a small amount of free isocyanate, atmospheric moisture serving as the crosslinking agent. This method is described in, for example, French Pat. No. 1,237,936. The disadvantages in this case is that the hardening, which begins at the surface, extends only very slowly to the deeper regions of the coating, so that the final properties are acquired only after weeks or months. No hardening at all occurs between large areas or in cavities.

Stable systems also can be formulated if the polyisocyanate is first reacted with a monofunctional reactant. The resulting adduct is referred to as a blocked isocyanate if it is less heat-stable than the product of the crosslinking reaction to be carried out subsequently. Under the action of heat, the blocking agent is eliminated, and the polyisocyanate undergoes crosslinking, forming more heat-stable bonds.

The principle is described in, for example, Frisch, "Fundamental Chemistry and Catalysis of Polyurethanes", *Polyurethane Technology*, Bruins, editor (Interscience Publishers, New York, 1969), pp. 11–13; and U.S. Pat. Nos. 4,068,086 and 4,251,428.

Because of the eliminated blocking agent, such formulations have technical and economic disadvantages: if the blocking agent remains in the crosslinked material, it changes the properties of the latter; if it vaporizes, it either has to be recovered or has to be removed from waste air.

U.S. Pat. Nos. 3,475,200; 4,251,427; and 4,251,428 describe polyisocyanates which melt at above 100° C. and at above 130° C., respectively, and which, with special polyols, give combinations which have long shelf lives and which can be hardened by heating to give coatings for fabrics or woven hoses.

The industrial disadvantages of the combinations described in these publications is that products having a long shelf life can be obtained only with a very small number of polyols having a special composition; therefore, these combinations are suitable for a limited number of uses.

U.S. Pat. No. 4,093,675 to Schure et al. describes an adhesion composition containing a poly(ester/ether) block copolymer (I) with terminal OH, which is chain extended and carboxylated with a dianhydride, to form a carboxylated poly(ester/ether), block copolymer having the formula:

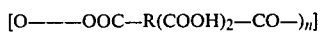

wherein —O———O— is a poly(ester/ether) block copolymer; R is alkyl, cycloalkyl or aryl; and n is 1 to 2. The thermoplastic block copolymer may be hardened to a thermosetting copolymer which contains a crosslinked component as well as a linear, flexible copolymer component. The crosslinked copolymer is a block copolymer in which one of the blocks itself is a block copolymer, and can resist creep at 150° C.

U.S. Pat. No. 4,430,479 to Merton et al describes an adhesive composition which comprises a thermoplastic polymer (I); 1-100 parts by weight of a crosslinkable polymer (II) being a hydroxy-substituted polyester of polyacrylate, or a polyamine; and a crosslinking agent, preferably a di- or polvisocyanate. (I) is preferably a polyester, polyurethane, polyamide, rubber or ethylene/vinyl acetate polymer, and optionally contains up to 100 parts by weight per 100 parts by weight of a conventional tackifying resin (typically hydrogenated and dehydrogenated rosin esters). The compositions have good adhesive strength; they exhibit delayed tack on heat activation, which is achieved at relatively low temperature and show high temperature resistance. They are non-blocking and may be applied to substrates well in advance (about 60 days) of the actual bonding operation.

U.S. Pat. Nos. 4,151,319 and 3,578,622 to McGrath concern a heat-activated adhesive which comprises (a) an acrylate polymer capable of room temperature, pressure-sensitive adhesion of at least 100 g/cm width; and (b) a room temperature-solid tackifying resin that provides increased room temperature tackiness when added to component (a), or to natural rubber, but which is in an amount sufficient to reduce room temperature, pressure-sensitive preadhesion of the adhesive to less than the pressure-sensitive adhesion of component (a) prior to addition of component (b). The tackifying resin permits conventional and effective room temperature handling of the coated sheets, while leaving the adhesive with the capacity for strong heat activated bonds.

U.S Pat. No. 4,194,618 to Norton describes a coated abrasive article comprises a backing member having abrasive grain adhered to it by an adhesive bond. The article has two of its ends joined together by a layer of an adhesive composition, which in its initial state is a preformed adhesive film which has been partially cured but which can still be activated at a temperature suitable for splicing the ends together. The adhesive film is the reaction product of an adhesive composition comprising a mixture of (a) a hydroxy-terminated polyurethane-polyester of hydroxyl No. 2-15; (b) an active hydrogen component having an active hydrogen equivalent weight of 27 to 500; (c) a component having free available isocyanate groups; and (d) a chlorinated aliphatic hydrocarbon, chlorinated aromatic hydrocarbon and/or alklylated polystyrene, this component being miscible with components (a), (b) and (c).

U.S. Pat. No. 4,476,259 to Kordomenos describes a solvent based thermosetting composition comprising: a hydroxy functional epoxy ester resin having a number average molecular weight ($M_n$) between 1,000 and about 5,000; and (b) a polyfunctional, hydroxy-reactive, crosslinking agent. The epoxy ester resin is formed by the reaction of diepoxide, which has been chain extended with diphenol and dicarboxylic acid, with hydroxyfunctional, secondary amine in a chain terminating reaction, in about a 1:1 equivalent ratio. The crosslinking agent is an aminoplast crosslinker or a blocked isocyanate crosslinking agent comprising isocyanate groups blocked by reaction with an active hydrogen bearing blocking agent.

U.S. Pat. Nos. 3,646,572 and 4,097,684 to Burr describe a catalytic adhesive for wire scribed circuit boards which comprises a flexible adhesive resin, alone or in combination with thermosetting resins. The flexible adhesive resins include epoxy resins, polyvinyl acetal resins, polyvinyl alcohol, polyvinyl acetate, natural and synthetic rubbers and acrylic polymers and copolymers. Preferred for use as the adhesive resin are natural and synthetic rubbers such as chlorinated rubber, butadiene-acrylonitrile copolymers, and acrylic polymers and copolymers.

The use of this adhesive in a process for manufacturing wire interconnection boards is mentioned in U.S. Pat. Nos. 3,674,602 to Keogh et al. and 3,674,914 to Burr. The adhesive layer is in the form of a partially cured thermosetting resin which is non-tacking at room temperature, but which, upon application of heat below the thermosetting temperature, becomes malleable and provides an adhesive bond when heated momentarily and cooled. In a step of the aforementioned process, after the wire conductor pattern is completed, it is permanently bonded to the substrate by pressing the wire conductors into the adhesive layer with heat and pressure, further curing the adhesive, or, by covering the wire conductors with a glass cloth reinforced, epoxy prepreg and then laminating the wire conductors into the adhesive with heat and pressure. Adhesives based upon those described in the aforementioned Burr patents have been used commercially for many years in the manufacture of wire scribed circuit boards.

In the aforementioned laminating step, occasionally, wire conductors laid down in the correct position would "swim" away when a cover layer of epoxy impregnated fiberglass was laminated over the wire conductors under heat and pressure. The hydraulic pressure of the melted epoxy resin, and partially melted adhesive layer beneath moved the wire conductors. Attempts to eliminate the aforementioned wire swimming, by increasing the partial cure of the adhesive before wiring, or by baking after the wire conductor pattern had been completed, or by modifying the laminating conditions were not successful.

The volume resistivity of adhesive layers of the type described by Burr is about $1 \times 10^4$ to $1 \times 10^6$ Megohms because high rubber content is needed to give tack for ultrasonic or heat bonding of the wire to the adhesive In some applications requiring high insulation resistance, higher volume resistivity is preferred.

U.K. Patent Specification No. 1,504,252 by Nicolas suggests wire scribing with a wire coated with adhesive or with a layer which can be rendered adhesive preferably immediately before scribing, and further suggests a dry film which is made self-adhesive by heating or passing the film through a suitable solvent. There is no teaching by Nicolas of non-blocking, heat activatable, wire coating compositions which can be cured to a C-stage and which are resistant to the effects of solvents and of soldering temperatures.

SUMMARY OF THE INVENTION

1. Objects of the Invention

It is an object of this invention to provide an adhesive coating composition which is activatable upon application of sufficient heat or ultrasonic energy without becoming C-staged and later can be C-staged.

It also is an object of this invention to provide an adhesive coating composition for wire scribed circuits with a volume resistivity, over the temperature range of 20° to 120° C., which is at least an order of magnitude greater than the adhesive compositions of the type described in the aforementioned Burr patents.

Another object of this invention is to provide a solid, adhesive composition which is non-tacky at room temperature and ultrasonic or heat activatable.

An object of this invention is to provide an adhesive which may contain up to 25% volatiles for facile ultrasonic activation, and also remains non-tacky in the absence of heat and pressure.

It is an object of this invention to provide an adhesive coating composition for wire scribed interconnection boards containing little or no natural or synthetic elastomers or rubbers.

It is a further object of this invention to provide a substrate with an adhesive coating thereon for preparation of wire scribed circuit boards.

An object of this invention is to provide an adhesive coating for wire which is non-blocking to itself and other surfaces, and which is flexible prior to activation.

An object of this invention is to provide a thermosetting adhesive coating composition which can behave like a hot melt adhesive, i.e., it liquifies and becomes tacky when heated to or above its melting range, and thereafter rapidly resolidifies when cooled to below said melting range, and which also can be thermoset by ultraviolet radiation.

An object of this invention is to provide an adhesive coating composition for wire which can adhere a wire to another coated wire or to an insulating substrate with a bond strength greater than 30 grams on 0.1 mm diameter wire.

2. Definitions

Unless otherwise defined herein, the terms used in this application are defined as set forth in the American Society for Testing and Materials Standard D907-82.

By heat activatable adhesive is meant a dry adhesive film that can be rendered tacky or fluid by application of heat or heat and pressure.

By hot melt adhesive is meant an adhesive that is applied in a molten state and forms a bond on cooling to a solid state.

By B-stage is meant an intermediate stage in the reaction of certain thermosetting resins in which the material softens when heated and swells when in contact with certain liquids, but may not entirely fuse or dissolve. The resin in an uncured thermosetting adhesive, is usually in this stage.

By blocked curing agent is meant a curing agent or hardener which has been rendered unreactive and can be reactivated as desired by physical or chemical means.

By blocking is meant an undesired adhesion between touching layers of a material such as occurs under moderate pressure during storage or use.

By bond strength is meant the unit load applied in tension, compression, flexure, peel, impact, cleavage, or shear, required to break an adhesive assembly with failure occurring in or near the plane of the bond.

By C-stage is meant the final stage in the reaction of certain thermosetting resins in which the material is relatively insoluble and infusible. Certain thermosetting resins in a fully cured adhesive layer are in this stage.

By doctor-bar or blade is meant a scraper mechanism that regulates the amount of adhesive on the spreader rolls or on the surface being coated.

By doctor-roll is meant a roller mechanism that is revolving at a different surface speed, or in an opposite direction, resulting in a wiping action for regulating the adhesive supplied to the spreader roll.

By filler is meant a relatively non-adhesive substance added to an adhesive to improve its working properties, permanence, strength, or other qualities.

By tack is meant the property of an adhesive that enables it to form a bond of measurable strength immediately after adhesive and adherend are brought into contact under low pressure.

By thermoplastic is meant a material that will repeatably soften when heated and harden when cooled.

By thermoset is meant a material that will undergo or has undergone a chemical reaction by the action of heat, catalysts, ultraviolet light, etc., leading to a relatively infusible state.

By $T_g$ is meant the glass transition temperature, the temperature at which an amorphous high polymer changes from a brittle vitreous state to a plastic state.

By onset of $T_g$ is meant the beginning of a glass transition in the blend of polymers in an adhesive as measured by differential scanning calorimetry or thermal mechanical analysis.

By onset of $T_m$ is meant the beginning of a polymer melting in the blend of polymers in an adhesive as measured by thermal mechanical analysis.

By wire scribing is meant affixing a wire to an insulating base to form an interconnection pattern.

3. Brief Summary Of The Invention

Briefly, this invention relates to a non-blocking, solid, adhesive composition which can be activated without becoming C-staged upon application of sufficient heat or ultrasonic energy for a time period of less than 1 second which comprises:

(a) a first component comprised of a film forming polymeric resin (1) having an average molecular weight ($M_W$) between about 10,000 and about 100,000 and (2) having an epoxide, hydroxyl or unsaturated functionality greater than about 2, said polymeric resin being selected from the group consisting of polyesters, polyurethanes and epoxies;

(b) a second component comprised of at least one filler, or at least one polyfunctional compound containing a polyaromatic backbone and having an average molecular weight below about 7,000, or mixtures thereof, the weight ratio of said first component to said second component being between about 1.5:1 and about 9:1; and (c) a curing agent which is capable of reacting or initiating a reaction with the functional groups of the polymeric resin to form crosslinks and cure the polymeric resin to a C-stage upon application of sufficient energy in the form of heat or radiant energy, said curing agent being non-reactive when the adhesive composition is activated by heat or ultrasonic energy for a time period less than one second, said curing agent being present in an amount sufficient to C-stage the polymeric resin;

said composition being flexible, and in the C-stage capable of forming an infusible composition which does not melt, flow or decompose when exposed for 10 seconds to molten solder at 260° C. and does not soften when exposed to dichloromethane at 25° C. for 10 seconds.

This invention also relates to a solid, adhesive composition which is thermosetting and can be activated upon application of sufficient heat or ultrasonic energy without thermosetting, said composition comprising:

(a) a film forming polymeric resin having a hydroxyl functionality greater than about 2 and selected from the group of polyols consisting of polyesters, polyurethanes, polyethers, epoxies, and combinations thereof, said resin having been reacted to the B-stage with a first curing agent which was present either in less than a stoichiometric quantity or was capable of reacting with functional groups that were present at concentrations of three or less on the polymer chain, said first curing agent being a polyisocyanate or polyisocyanurate and having been present in an amount sufficient to react with 10 to 60 percent of the hydroxyl groups to B-stage the polymeric resin sufficiently to provide the composition with non-blocking properties; and (b) a second curing agent which is capable of reacting or initiating a reaction with the hydroxyl groups of the polymeric resin to form crosslinks and cure the polymeric resin to a C-stage upon application of sufficient energy in the form of heat or light, said second curing agent being non-reactive when the adhesive composition is activated by heat or ultrasonic energy for a time period less one second;

said composition being flexible prior to being crosslinked, and capable of forming an infusible composition in the C-stage which does not melt, flow or decompose when exposed for 10 seconds to molten solder at 288° C. and does not soften when exposed to dichloromethane at 25° C. for 10 seconds.

This invention further relates to a non-blocking, solid, adhesive composition which can be activated without becoming C-staged upon application of sufficient heat or ultrasonic energy which comprises:

(a) a film forming epoxy resin which has been reacted to a B-stage polymer having an average molecular weight greater than about 30,000;

(b) a polyfunctional resin having an average molecular weight below about 5,000 and containing a polyphenol backbone, the weight ratio of said first component to said second component being between about 1:1 and about 3:1; and (c) a curing agent which is capable of reacting or initiating a reaction with the functional groups of at least one of the resins to form crosslinks and cure the resin to a C-stage upon application of sufficient energy in the form of heat or radiant energy, said curing agent being non-reactive or blocked at the conditions which will activate the adhesive composition, said curing agent being present in an amount sufficient to C-stage at least one of the resins;

said composition being flexible, and in the C-stage capable of forming an infusible composition which does not melt, flow or decompose when exposed for 10 seconds to molten solder at 260° C. and does not soften when exposed to dichloromethane at 25° C. for 10 seconds.

4. Detailed Description Of The Invention

Suitable film forming polymeric resins useful in the adhesive compositions of the present invention include those polyols having an epoxide, hydroxyl or unsaturated (e.g. acrylic) functionality greater than 2 and are selected from the group consisting of polyesters, epoxies, and polyurethanes.

Suitable polyesters include those prepared from (1) one or more diacids selected from saturated and unsaturated aliphatic dicarboxylic acids containing from 4 to about 10 carbon atoms, aromatic dicarboxylic acids selected from terephthalic acid, isophthalic acid, phthalic acid, 4,4'-diphenylthioether dicarboxylic acid, 4,4'-diphenylamine dicarboxylic acid, and saturated and unsaturated aliphatic dimer acids (i.e., the polymerized product of two molecules of an unsaturated fatty acid containing 12 to 26 carbon atoms) and mixtures and derivatives thereof; and (2) one or more saturated or unsaturated aliphatic diols containing from 2 to 12 carbons atoms, long chain aliphatic diols having an average molecular weight of 200 to 4000, polyethylene oxide and polypropylene oxide polymers and copolymers, and allyl ethers of polyethylene and polypropylene oxide, and polyhydroxyl compounds such as glycerine, trimethylolpropane and neopentyl alcohol and mixtures and derivatives thereof.

Suitable epoxy resins include diglycidylethers of bisphenol A having epoxy equivalent weights of 400 to 6,000, diglycidylethers of halogenated bisphenol A having epoxy equivalent weights of 450 to 2,000, epoxy novolacs or polyglycidyl ethers of phenol-formaldehyde, polyglycidyl ethers of tetraphenylethane and polyglycidylethers of resorcinol. Also suitable are very high molecular weight copolymers of bisphenol A and epichlorhydrin with molecular weights over about 50,000. Preferred epoxy resins are diglycidylethers of bisphenol A having epoxy equivalent weights of 1,000 to about 6,000.

Suitable polyurethanes include the reaction products of diisocyanates and polyesters, polyethers or polyester/polyether copolymers. Preferred polyurethanes are those containing aliphatic linkages of 100 to 1000 daltons. It is also preferred that the polyurethanes contain some aromatic groups (e.g., isophthalate or terphthalate ester linkages groups or toluene diurethane groups). More preferably, the polyurethanes contain allyl, methallyl, acrylic or methacrylic groups.

Suitable film forming polymeric resins according to this invention may be obtained by using a polyol intrinsically having an average molecular weight between about 10,000 and about 100,000, preferably greater than about 15,000, more preferably greater than about 30,000, and preferably less than about 70,000 or by reacting a low molecular weight polyol of this invention to a B-stage with a curing agent which is present either in less than a stoichiometric quantity or is capable of reacting with three or less functional groups that were present at low concentrations on the polymer chain Preferably, the curing agent used for B-staging the low molecular weight polyol is an isocyanate or an amide.

The film forming polymeric resins of this invention provide adhesion and flexibility for the adhesive composition. Adhesion to a variety of surfaces is enhanced by polar groups along the polymer chain. Flexibility of the adhesive composition is provided by internal plasticization of aliphatic portions of the polymeric resin.

The film forming polymeric resin preferably has an epoxide, hydroxyl or unsaturated functionality greater than about 2. The functionality is available for crosslinking with a curing agent to C-stage the adhesive composition. Examples of unsaturated functional groups include: vinyl, allylic, methyallylic, and acrylic, methacrylic and 1-propenyl groups.

The adhesive composition may contain one or more polyfunctional compounds containing polyaromatic backbones and having an average molecular weight below about 7,000, and preferably between about 500 and about 5,000, one or more fillers, or mixtures thereof. The polyfunctional compound serves a dual purpose: (1) it provides the C-staged adhesive composition with high-temperature and solvent resistance; and (2) it enhances the non-blocking properties of the C-stageable adhesive composition, especially when the polyfunctional compound is B-staged or B-staged together with the film forming polymeric resin.

Suitable polyfunctional compounds containing polyaromatic backbones include: (1) epoxy resins and epoxy novolac resins such as diglycidylethers of bisphenol A, polyglycidylethers of phenol-formaldehyde, polyglycidylethers of tetraphenylethanes and polyglycidylethers of resorcinol; (2) polyaromatic compounds as described in U.S. Pat. Nos. 4,435,497; 4,439,291; and 4,463,169, having acryloyloxy or methacryoloyloxy and alkyl, methallyl or 1-propenyl groups in the molecule, acrylate and methacrylate esters of di-and polyepoxides; (3) polyaromatic epoxide resins having at least two epoxide groups and at least two photopolymerisable groups per average molecule, as described in U.S. Pat. No. 4,074,008; and (4) polyisocyanates and polyisocyanurates containing multiple aromatic groups, e.g., triisocyanurates of toluene diisocyanates.

The filler enhances the non-blocking properties of the adhesive composition. Moreover, the filler reinforces, and controls shrinkage during cure of, the adhesive composition. Examples of suitable fillers include inorganic carbonates, oxides, sulfates, sulfides, calcium carbonate, calcium sulfate, barytes, blanc fixe, zinc sulfide silica, diatomaceous earth, clays, magnesium silicate, wollastonite, alumina hydrate, zinc oxide, titanium dioxide, zirconias zirconium silicate and organic fillers such as organic pigments and insoluble polymers powders. Preferred fillers include alumina trihydrate, silica, zirconium silicate and polyethylene powders.

The selection of the curing agent to crosslink the functional groups and cure the adhesive composition to C-stage will depend on the functional groups available. If the functional groups are hydroxyl, the curing agent may be selected from blocked isocyanates which at temperatures above 75° C. preferably which unblock at temperatures above 100° C. Suitable blocked isocyanate curing agents are believed to include those described by U.S. Pat. No. 4,476,259 to Kordomenos, incorporated by reference.

If the functional groups available in the B-adhesive composition are epoxide, the curing agent is selected from latent epoxy curing agents such as dicyandiamide and the boron trifluoride-monoethylamine complex. Other latent curing agent systems believed to be suitable include anhydride curing agents with latent catalysts. Anhydride curing agents include dodecenyl succinic anhydride, chlorendic anhydride, hexahydrophthalic anhydride, NADIC methyl anhydride, phthalic anhydride, succinic anhydride and tetrahydrophthalic anhydride. Latent catalysts for use with anhydride curing agents include boron trifluoride-monoethylamine complex, quaternary ammonium halides such as benzyltrimethylammonium chloride, stannous octoate, zinc stearate, extra-coordinate siliconate salts, triethanolamine borate, triethanolamine titanate and quaternary phosphonium compounds such as methyltrioctylphosphonium dimethylphosphate, tetrabutylphosphonium acetate, methyltributylphosphonium dimethylphosphate, benzyltriphenylphosphonium chloride, tetrabutylphosphonium chloride, methyltriphenylphosphonium dimethyl phosphate and triphenylethylphosphonium iodide. Also suitable for cross linking epoxide groups are blocked Lewis acid catalysts which can be unblocked by ultraviolet radiation. The blocked Lewis acid catalysts include aromatic iodonium complex salts (see, for example, U.S. Pat. Nos. 3,565,906; 3,712,920; 3,759,989; and 3,763,187) and aromatic sulfonium complex salts, e. g., triphenylsulfonium hexa fluoroantimonate and triphenylsulfonium hexafluorophosphate.

If the functional groups available for curing the adhesive composition to C-stage are unsaturated carbon-carbon double bonds, a free radical initiator is used as curing agent. Suitable free radical initiators which are activated by heat include 1,1'-azobis(cyclohexane carbonitrile), dicumyl peroxide, 1,1'-bis(tert-butylperoxy)-diisopropylbenzene and the like. Suitable free radical photoinitiators include benzoin, benzoin alkyl ethers, benzil ketals, dialkoxyacetophenones, di- and trichloroacetophenones, benzophenone, 4,4'-dimethylaminobenzophenone, thioxanthone derivatives such as thioxanthone, 2-chlorothioxanthone, 2-methylthioxanthone, 2-ethylthioxanthone and the like, fluorenone, dibenzosuberone, 6,11-dihydrodibenzothiepin-11-one, 2-chlor-6,11-dihydrodibenzothiepin-11-one, and quinones such as anthraquinone, 2-ethylanthraquinone, tertiary butyl anthraquinone, and anthraquinone sulfonate. Preferred is 2,2-dimethoxyphenyl-2-acetophenone.

The adhesive coating compositions may contain additives such as flow control agents, and wetting agents to improve the wire coating process; pigments or colorants; and surface lubricants to enhance anti-blocking properties. Such conventional additives are well known to those skilled in the art.

It has been discovered that the ratio of film forming resin to filler and/or polyfunctional compound should be in the range between about 1.5:1 and about 9:1. Preferably, the ratio is between about 2:1 and about 7:1. It has been found that when the ratio is below about 1.5:1, the adhesive composition, when B-staged, forms a poor film and is difficult to uniformly coat on a wire, and when C-staged, the adhesive composition is brittle and may crack or break under stress. It also has been found that when the ratio of greater than about 9:1, the adhesive composition when C-staged does not have resistance to molten solder at 260° C. and becomes crazed, pitted or stress corrodes when exposed to dichloromethane at 25° C. for one minute.

The polymeric resin may be formed by reacting polyisocyanates with a low molecular weight polymer having a hydroxyl functionality greater than 2, said polymer selected from the group consisting of polyesters, polyethers, and epoxies.

The solid adhesive composition of this invention also may include a polyester resin having an average molecular weight between about 1,000 and about 15,000, said polyester resin having a hydroxyl functionality greater than 2.

In one embodiment, the functional groups of the film forming polymeric resin are hydroxyl and the curing agent is a blocked polyisocyanate In another embodiment, the functional groups of the film forming polymeric resin are unsaturated double bonds such as acrylic and allylic groups, and the curing agent is a free radical initiator.

It has now been found possible, by controlling the amount and type of cross-linking introduced into a C-stagable adhesive coating composition, to render said composition heat activatable until said composition is C-staged. Thus, until the adhesive coating composition of the present invention is C-staged, it can be rendered tacky upon application of sufficient heat or ultrasonic energy and will rapidly resolidify upon cooling, i.e., upon dissipation of said energy. The resolidified adhesive coating composition can be C-staged which will increase the temperature resistance of the composition without altering other desirable properties, i.e., the dimensional stability and adhesive strength of the composition. In preferred compositions, for example, cross-linking is achieved at a temperature higher than that required for heat activation through use of a polyol as defined above having a hydroxy or acrylate functionality greater than 2 and a blocked isocyanate crosslinking agent or a ultra-violet curing agent capable of reacting with either the hydroxylated or acrylated polyol and any available sites (e.g., residual functionality) in the polyol.

The time for activation of the adhesive coating is preferably short. Wire scribing speeds vary up to 250 mm/sec. The normal wire scribing speed is 75 mm/sec. The adhesive is activated simultaneously with, or the instant before wire scribing to avoid activated adhesive damaging the wire feeding mechanism. The length of adhesive activated at one time is preferably less than 10 mm and more preferably about 0.1 mm. The activation time is preferably less than second more preferably in the range of 0.2 to 200 milliseconds. The temperature for activation is below or up to the unblocked temperature for the blocked curing agents. The blocked curing agents are subsequently reacted at temperatures generally higher than the heat activation temperature of the adhesive and for time periods in the range of 5-100 minutes.

The adhesive coating compositions of the present invention may be applied to substrates well in advance of the actual bonding operation. The composition may be simply activated by heat, light or ultrasonic energy when it is desired to perform the bonding operation. This permits bonding at the work site to be accomplished without the presence of flammable solvents.

Regarding the means of application, the adhesive compositions of the present invention may be applied to substrates as solutions in volatile organic solvents (such as butanone, toluene, xylene, glycol ethers, glycol ether acetates, and the like) by methods common to solvent-based adhesives, i.e., spray coating, doctor-blade coating, roll coating, doctor-roll coating and the like. The adhesive coating compositions may be conveniently spray applied to substrates as solutions in volatile organic solvents using conventional spray equipment. The result in any case is a non-tacky, solid, crosslinkable adhesive layer which dries quickly in air and which can be heat activated immediately or thereafter up to the time it is C-staged.

Since the adhesive coating compositions of this invention can be applied as a solution which then is dried, they are useful for encapsulating wires or as an adhesive layer on a substrate such as a printed wiring board. The adhesive coating compositions of this invention have many advantageous properties. For example, the property of being non-blocking when in the solid form allows an adhesive coated wire to be spooled. The heat activatable property prior to being C-staged allows the wire to adhere rapidly and easily to another substrate or to itself. The C-stagable property allows the adhesive composition to be an excellent insulator and to withstand high temperature service and harsh chemical environments.

The adhesive bond between the wire and the substrate may be measured on a straight section of wire by vertically peeling the wire in a direction away from and perpendicular to the board surface, or alternatively peeling the wire in a direction along the board surface which is transverse to the cylinder axis of the wire. A C-staged adhesive according to this invention should be capable of bonding a 0.1 mm diameter wire with a peel strength of 30 to 60 grams.

The film forming polymeric resins useful in the present invention should have a molecular weight sufficiently high to be good film formers, to become non-tacky and non-blocking when dry.

EXAMPLE 1

A heat activated adhesive was prepared with a blend of a B-staged polymer of a high molecular weight allylic urethane and a B-staged epoxy acrylate. The B-stage mechanism is the reaction of polyisocyanurate with the hydroxyl groups of both polymers. An ultraviolet initiated, free radical curing agent was incorporated in the blend to enable complete curing to a C-stage composition through the allylic and acrylic groups on the polymers. The adhesive was prepared from the formulation below.

| Component | weight |
|---|---|
| Polyurethane resin 32% in butanone, the polymer was hydroxyl terminated with allylic groups evenly spaced along the polymer chain; the repeating molecular weight was approximately 1000 and the hydroxyl no. was 11.3 mg KOH/g (commercially available as S126-224 TM from Bostick Div. of Emhart Chemical Group, Middleton, MA.) | 315 g |
| Bisphenol A epoxy diacrylate ester with a molecular weight of 834 (commercially available as CMD 3703 TM from Celanese Specialty Resins, Louisville, Kentucky.). The chemical formula is believed to be $CH_2=CH-CO-[O-CH_2-CHOH-CH_2-O-C_6H_4-C(CH_3)_2-C_6H_4-O-CH_2-CHOH-CH_2-O-C_6H_4-C(CH_3)_2-C_6H_4-O-CH_2-CHOH-CH_2-]_2-O-CO-CH=CH_2$ | 15 g |
| Polyisocyanurate of toluene diisocyanate 50% in butyl acetate (commercially available from Mobay Chemical Corp, Pittsburgh, PA as Desmodur IL TM) | 19.6 g |
| 2,2-dimethoxy-2-phenylacetophenone (commercially available as Irgacure 651 TM from Ciba-Geigy Corp.) | 2.5 g |
| 4-methoxyphenol | 0.5 g |
| toluene 7% by weight of the total formulation | |

Preparation of the Heat Activated Adhesive Solution

The 15 g of the diacrylate epoxy ester was reacted with 9.6 grams of polyisocyanurate solution for 3 hours at 95° C. to B-stage the epoxy acrylate resin by crosslinking the hydorxyl groups. This produced a B-stage epoxy acrylate polymer with an average molecular weight of 5400.

The allylic polyurethane resin was reacted with 10 grams of polyisocyanurate solution for 1 hour at 95° C. This polymerized the resin to a B-stage polymer with an average molecular weight of 30,000 to 40,000.

The two B-stage polymers were combined and refluxed for 1 hour at 95° C. Butanone was added as necessary to control viscosity.

After refluxing the B-stage polymers together, the solution was cooled and 3.5 grams of 2,2-dimethoxy-2-phenylacetophenone and 0.5 grams of 4-methoxyphenol dissolved in 30 grams of butanone were added to the polymers. The weighing dish used to weigh the 2,2-dimethoxy-2-phenylacetophenone and 4-methoxyphenol was washed three times with 20 grams of butanone and the wash solvent was also added to the polymer solution. The solution was then mixed thoroughly for 30 minutes and weighed. 7% by weight toluene was added, and then the solution was mixed for an additional 30 minutes.

Application of the Heat Activated Adhesive to Wire

Copper wire 0.1 mm in diameter covered with a layer of polyurethane insulation to a diameter of 0.14 mm was coated with a uniform layer of adhesive by repetitively passing the wire through the adhesive solution, drawing the wire through a diamond die and passing it through an oven to dry the coating and remove residual solvents. For each repetition of the process, the diamond die was of larger diameter. The first die was 0.152 mm diameter and the diameter of each succeeding die was 0.0063 mm larger than the previous die. The coating process was continued until the outside diameter of the wire with the dry, heat activated adhesive coating was 0.26 mm to 0.27 mm. The wire was wound on a spool for storage until use. The wire was coated and stored in areas where ultraviolet light was excluded The heat activated adhesive coating on the wire did not block in storage.

Bonding Adhesive Coated Wire to a Substrate

The wire coated with the heat activated adhesive was wire scribed to six printed wiring boards to modify a conductive pattern on a surface of the boards. During the scribing process, the wire was automatically placed on and bonded to the surface of the printed wiring boards. The surface of the printed wiring boards comprised solder mask areas, epoxy substrate areas and exposed metal areas. The printed wiring boards were mounted on a moveable work table. The wire was fed out onto the surface of the printed wiring boards from a scribing head assembly. The wire was laid on each surface by moving the work table relative to the scribing head assembly and by rotating a scribing feed mechanism in a predetermined direction. The wire scribing head assembly and the table were numerically controlled.

As the wire was fed toward each the surface, and just prior to its reaching the surface, the portion of the heat activatable adhesive coating which would contact the surface was exposed to a beam from a $CO_2$ laser (Model RF 165 TM from Laakman Electro-optics, Inc.). The laser was a sealed $CO_2$ laser with a radio frequency excited wave guide, a power output of 20 watts CW (continuous wave), a gaussian beam shape, and having a maximum modulation frequency of 10 kHz.

The laser energy was discharged at the wire in the form of a pulsed beam. The pulse width of the beam was about 200 microseconds. The pulse amplitude of the beam was about 20 watts. The spot from the beam was approximately circular and had a diameter of about 1 mm. The beam was pulsed when the wire had been scribed about 0.2 mm. The maximum scribing speed was about 5 m/min The spot size and pulse frequency were adjusted so that each section of heat activatable adhesive coated wire received about five overlapping laser pulses. The activated adhesive coating contacted the surface of the printed wiring board and the adhesive coating became non-tacky and formed a solid bond with the surface in about 200 milliseconds.

The wire was securely bonded by the heat activated adhesive to the solder mask, epoxy substrate and exposed metal areas as well as to other scribed wires. The bond of the wire to the surface measured by peeling the wire along the surface in a direction transverse to the wire path ranged between 40 and 90 grams. When all the wires to modify the conductive pattern had been scribed to the printed wiring boards, the boards were exposed to 19.5 joules/cm$^2$ of ultraviolet light to cure the heat activated adhesive to the C-stage.

Printed wiring boards with the wire scribed conductors were soldered at 265° C. for 10 seconds. There was no failure of the adhesive bond between the wires and the substrate, and no visible evidence of attack on or damage to the adhesive coating. Printed wiring boards with wire scribed conductors were placed in dichloromethane for 2 minutes, dried in air at ambient temperature for 10 minutes and examined with the aid of a microscope. There was no failure of the adhesive bond between the wires and the substrate, and no pitting, crazing or other indication of attack on the adhesive coating.

EXAMPLE 2

A heat activatable adhesive was formulated from a polyester resin believed to have a molecular weight of about 20,000 and a hydroxyl functionality of 2, and with a blocked isocyanate to provide a C-stage curing agent for the final cure. The ratio of resin to blocked isocyanate was 10:3. The formulation is as follows:

| Component | weight |
| --- | --- |
| Polyester adhesive resin with dihydroxy functionality and average molecular weight of 20,000 prepared from isophthalic acid and a nine carbon dibasic acid esterified with ethylene glycol and diethylglycol as a 51% solution in butanone (commercially available as Adcote 76P1 TM from Morton Chemical Corp.) | 192 g |
| Blocked aliphatic isocyanate which will unblock at 100-110° C. (The blocked polyisocyanate is 75% solids dissolved in a 50/50 mixture of xylene and 2-ethoxyethylacetate commercially available from Mobay Chemical Corp., Pittsburgh, PA as Desmodur VP KL 54-2371 TM.). | 40 g |
| Fumed silica having a surface area of 200 m$^2$/g (commercially available from Cabot Corp., Tuscola, IL as CAB-O-SIL TM, M-5) | 7.5 g |
| Zirconium silicate powder average particle size 0.55 micrometers (commercially available from TAM Ceramics Inc., Niagara Falls, NY as Excelopax TM.) | 5 g |
| Fluorescent pigment (commercially available as Day-Glo Orange TM from Day-Glo Color Corp., Cleveland, OH) | 1.5 g |

The ingredients were milled together on a three roll paint mill and diluted with to 20% solids with methyl ethyl ketone for coating on wire.

A film of adhesive was cast by doctor blade, dried with hot air and cured for 45 minutes at 85° C., 45 minutes at 120° C. and 45 minutes 155° C. After curing, the onset of $T_m$ was 120°–130° C.

Insulated wire 0.14 mm in diameter with a copper core 0.1 mm in diameter was overcoated with a layer of the heat activatable adhesive and dried with forced hot air. The application of adhesive was repeated until the diameter of the wire plus the heat activatable adhesive was increased to 0.27 mm (at least 85% larger than the original diameter).

The heat activatable adhesive coated wire was scribed onto the surface of an glass cloth reinforced epoxy laminate (NEMA type FR-4) using a numerically controlled wire scribing head assembly and work table similar to Example 1. A hot air jet (air heated to a temperature of 120° to 150° C.) was used to activate the adhesive layer instead of the laser beam, used in Example 1, and the roller on the scribing head was used to place the activated adhesive coated wire in contact with the FR-4 surface as in Example 1. The bond of the wire to the surface measured by horizontally peeling the wire perpendicular to the wire path ranged between 30 and 50 grams.

After wire scribing, the FR-4 laminate was heated to at least 120° C. to crosslink the adhesive forming an infusible bond between the wire and the FR-4 laminate capable of withstanding molten solder at 288° C. for 10 seconds. The laminate was heated in three stages to crosslink the adhesive: 45 minutes at 85° C., 45 minutes at 120° C., and 45 minutes at 155° C.

The wire scribed circuit patterns were soldered at 260° C. for 10 minutes After soldering, no lifting or deterioration of the adhesive or of the bond between the wire and the laminate was apparent.

The wire scribing was repeated except that instead of activating the adhesive layer with a laser beam or a hot air jet, the adhesive layer was activated ultrasonically. The ultrasonic system include an ultrasonic generator, a power supply, a coil, a transducer, feedback elements and a stylus tip. The heat activatable adhesive coated wire was fed through the scribing head and the stylus tip, which has a groove under which the adhesive coated wire fit. The ultrasonic transducer produced mechanical vibrations at a rate of about 25 kHz. These vibrations activated the adhesive coating and adhered the wire to the FR-4 substrate.

EXAMPLE 3

A heat activated adhesive coating composition was prepared based on a diacrylate ester of a diepoxy bisphenol A resin combined with a solid epoxy resin. The diacrylate ester resin was CMD 3703 ™. The solid epoxy resin (EpiRez 540Cv commercially available from Celanese Coatings and Specialities Co.) had an epoxy equivalent weight of 1600.

In order to make a non-blocking adhesive formulation, the molecular weight of the epoxy resin was increased from about 3,200 to over 35,000 by reacting it with a polyamide curing agent. Similarly, the molecular weight of the diacrylate ester (CMD 3703) was modified with 3 grams of a polyisocyanurate (DESMODUR IL ™) per 100 grams of epoxy acrylate ester to partially cure or B-stage the system and increase the molecular weight from 830 to about 5,500. The epoxy acrylate ester and the polyisocyanurate were refluxed at 80° C. for 30 minutes to B-stage the epoxy acylate ester before adding the other components of the adhesive.

A free radical initiator was also added to the heat activated adhesive formulation to cure the adhesive to the C-stage after it has been used to bond scribed wires to a board. For thermal curing, dicumyl peroxide was added. Dicumyl peroxide generates free radicals at temperatures in excess of 150° C. For ultraviolet light curing, 2,2-dimethoxy-2-phenylacetophenone was used as a free radical generator. The adhesive was refluxed at 80° C. for 30 minutes to B-stage the adhesive before coating the wire.

The final formulation was:

| Component | weight |
| --- | --- |
| Epoxy diacrylate ester (CMD 3703) | 40 g |
| Diglycidyl ether of bisphenol A, epoxy equivalent weight 1600 (EPIREZ 540C) | 60 g |
| Flow promoter (MODAFLOW ™ commercially available from Monsanto Co., believed to be a low molecular weight butyl acrylate) | 1.3 g |
| Perfluorinated surfactant (FLUORAD 430 ™ commercially available from 3M Corp.) | 0.3 g |
| Polyamide curing agent with an approximate equivalent weight of 140, believed to be the reaction product of 3 moles of linoleic acid dimer and 4 moles diethylene triamine (commercially available from Shell Chemical Co. as Epon V-40 ™) | 5 g |
| Polyisocyanurate, 50% solution (DESMODUR IL) | 1.2 g |
| Dicumyl peroxide | 0.5 g |
| or | |
| 2,2-dimethoxy-2-phenylacetophenone (IRGACURE 651) | 2.5 g |
| 4-methoxyphenol | 0.5 g |

This composition was dissolved in methyl ethyl ketone to make a solution with 20 percent solids. The solution was applied to an insulated wire with an outside diameter of 0.14 mm, and the adhesive coating was dried with forced air at 65° C. the overall diameter of the wire was increased to 0.23 mm (64%). The heat activatable adhesive coated wire was scribed to an FR-4 substrate with hot air jet activation, as in Example 2. The adhesive bond of the wire to the substrate was much lower than Example 2.

Wires were coated with the same adhesive solution to obtain a overall diameter of 0.26 mm (85% increase). Good adhesion was obtained by scribing the wire of 0.26 mm diameter, showing that a heavier coating of adhesive on the wire is preferable to achieve a superior bond of scribed wires to the substrate.

EXAMPLE 4

A heat activatable adhesive which could be converted to a C-stage by ultraviolet radiation was formulated as follows:

| Component | Weight |
| --- | --- |
| 60% solution in propylene glycol monomethylether acetate of a urethane acrylic polymer formed by aliphatic polyethers and toluene diisocyanate, having a molecular weight of approximately 10,000, about four pendant carboxyl groups, unsaturation of 0.0011 equivalents/100 g, $T_g$ = 28–32° C., and an acid number 24 (commercially available as Puralast 2195 ™, Polymer Systems Corp., East Brunswick, NJ) | 149 g |
| 65% solution in propylene glycol monomethylether acetate of a urethane acrylic polymer having a molecular weight of about 16,000 and about 7 pendant carboxyl groups, unsaturation of 0.0075 equiv- | 16 g |

-continued

| Component | Weight |
|---|---|
| alents/100 g, $T_g$ = −15° C., and an acid number of 26 (commercially available as Puralast 2186 ™ from Polymer Systems Corp.) | |
| Epoxy diacrylate ester (CMD 3703) | 15 g |
| 50% solution in butyl acetate of the polyisocyanurate of toluene diisocyanate (Desmodur IL) | 9.6 g |
| 2,2-dimethoxy-2-phenylacetophenone | 3.5 g |
| 4-methoxyphenol | 0.5 g |
| Alumina trihydrate, superfine hydrated alumina with a particle size of 2-3 micrometers (commercially available from Solem Industries, Inc. Atlanta, GA) | 40 g |
| toluene to 7% of the total weight. | |

The epoxy diacrylate ester and the polyisocyanaurate were refluxed together at 95° C. for 3 hours to form a higher molecular weight epoxy acrylate before mixing the rest of the formulation together. The 2,2-dimethoxyphenyl-2-acetophenone and 4-methoxyphenol were dissoved in 5 g of butanone. The formulation was compounded on a Cowles Dispersator ™ for 30 minutes to form a uniform adhesive solution. The adhesive was coated on wire as in Example 1. The wire was scribed onto a printed wiring board and the adhesive cured to a C-stage as in Example 1. The bond of the wire to the surface measured by peeling the wire in a direction along the surface and transverse to the wire path ranged between 85 and 110 grams. After curing, the bond between the wire was not affected by soldering or by 2 minutes immersion in dichloromethane.

EXAMPLE 5

The solution of heat activatable adhesive was doctor blade coated on an FR-4 epoxy-glass laminate. The wet film thickness of the heat activatable adhesive coating was 0.1 mm. The adhesive coating on the FR-4 laminate was dried for one hour at 38° C. After drying, the adhesive film thickness was 0.06 mm.

A discrete wire conductive pattern was wire scribed on the adhesive coated FR-4 laminate with copper wire. The copper wire had a diameter of 63 micrometers, polyimide insulation 20 micrometers thick, and an outer coating of polyvinyl butyral 8 micrometers thick. The wire was scribed into the heat activatable adhesive layer using ultrasonic energy as descibed by Keogh et al., U.S. Pat. No. 3,674,602. The wire was scribed to heat activatable adhesive coated substrate as described in Example 1, except that instead of activating the adhesive with a laser beam, it was activated with an ultrasonic system. The ultrasonic system included an ultrasonic generator, a power supply, a coil, a transducer, feedback elements and a stylus tip. The coil, transducer and stylus head were part of the wire scribing head. The wire was fed through the scribing head and the stylus tip, which had a goove under which the wire fit. The ultrasonic transducer vibrated the stylus at about 25,000 Hz which activated the adhesive coating underneath the stylus and the wire and bonded the wire to the substrate.

After the discrete wire conductive pattern was formed, the heat activatable adhesive layer was cross-linked to a C-stage by exposure to ultraviolet light.

EXAMPLE 6

A heat activatable adhesive was prepared by the procedure of Example 4 except that the polyisocyanurate was omitted, and the epoxy diacrylate ester was not refluxed or reacted prior to adding it to the adhesive solution. The formulation was as follows:

| Component | Weight |
|---|---|
| 60% solution of urethane acrylate polymer (Puralast 2195) | 150 g |
| 65% solution of urethane acrylate polymer (Puralast 2186) | 15.4 g |
| Epoxy diacrylate ester (CMD 3707) | 15 g |
| 2,2-dimethoxy-2-phenylacetophenone | 3.5 g |
| 4-methoxyphenol | 0.5 g |
| Alumina trihydrate | 30 g |
| Butanone to adjust viscosity for coating | |

The heat activatable adhesive solution was cast as a film by doctor blade in order to measure the $T_g$. After drying and before ultraviolet radiation curing, the onset $T_g$ was 13°-15° C.; after ultraviolet radiation curing to the C-stage, the onset of $T_g$ was 22°-25° C.

The heat activatable adhesive solution was coated on an insulated copper wire and the wire was scribed onto a printed wiring board as in Example 1. The wire scribed printed wiring boards were exposed to ultraviolet light to cure the adhesive to a C-stage so that it became resistant to soldering temperatures and to solvents.

EXAMPLE 7

In order to obtain a heat activatable adhesive coating for wires with even higher resistance to blocking, the formulation of Example 5 was repeated except that the softer, 16,000 molecular weight urethane acrylate resin, which contains less of the aromatic toluene diisocyanate component, was not used. The formulation was as follows:

| Component | Weight |
|---|---|
| 60% solution of urethane acrylic resin (Puralast 2195) | 167 g |
| Epoxy acrylate (CMD 3703) | 15 g |
| 2,2-dimethoxy-2-phenylacetophenone | 3.5 g |
| 4-methoxyphenol | 0.5 g |
| Alumina trihydrate | 30 g |
| Fine particle high density polyethylene powder (commercially available as Polymist ™ B6 from Specialty Chemicals Div., Allied Corp. Morristown, NJ) | 2 g |
| Butanone to adjust viscosity for coating | |

Films were cast from the adhesive solution and dried. The onset $T_g$ after drying the adhesive film was 10°-15° C. The adhesive was C-staged with ultraviolet light after C-stage; the onset of $T_g$ was increased to 29°-34° C. and the onset of $T_m$ was 160°-170° C.

The adhesive solution was coated on wire as in Example 1 and the wire scribed onto a printed wiring board as in Example 1. The bond of the wire to the surface, measured by horizontally peeling the wire perpendicular to the wire path, ranged between 80 and 105 grams.

Printed wiring boards with the wire scribed conductors were soldered at 265° C. for 10 seconds. There was no failure of the adhesive bond between the wires and the substrate, and no visible evidence of attack on or damage to the adhesive coating. Printed wiring boards with wire scribed conductors were placed in dichloromethane for 2 minutes, dried in air at ambient temperature for 10 minutes and examined with the aid of a microscope. There was no failure of the adhesive bond between the wires and the substrate, and no pitting, crazing or other indication of solvent attack on the adhesive.

After the adhesive coating was cured by ultraviolet light, the strength of the adhesive between the wire and the printed wiring board was measured by a continuous perpendicular vertical peel test. The vertical peel rate was 250 mm/min. The average peel strength on a straight line was 40 grams.

What is claimed is:

1. A non-blocking, solid adhesive composition activated upon application of sufficient heat or ultrasonic energy which comprises:
   (a) a first component comprising a polymeric resin having epoxide, hydroxyl or unsaturated functional groups which provide a functionality greater than 2, said polymeric resin being selected from the group of resins consisting of a polyester resin, a polyurethane resin and an epoxy resin;
   (b) a second component comprised of at least one filler, or at least one polyfunctional compound containing a polyaromatic backbone and having an average molecular weight below about 7,000, or mixtures thereof the weight ratio of said first component to said second component being between about 1.5:1 and about 9:1;
   (c) a curing agent which is capable of reacting or initiating a reaction with the functional groups of the polymeric resin to form crosslinks and cure the polymeric resin to a C-stage upon application of sufficient energy in the form of heat or radiant energy, said curing agent being non-reactive blocked at the conditions which will activate the adhesive composition, said curing agent being present in an amount sufficient to C-stage the polymeric resin;
   said composition being flexible, and in the C-stage capable of forming an infusible composition which does not melt, flow or decompose when exposed for 10 seconds to molten solder at 260° C. and does not soften when exposed to dichloromethane at 25° C. for one minute.

2. The composition of claim 1 wherein said first component is comprised of a film forming polymeric resin having an average molecular weight ($M_w$) between about 10,000 and about 100,000.

3. The composition of claim 1 wherein the polymeric resin has been formed by reacting polyisocyanates or polyisocyanurates with lower weight molecular polymers having a hydroxyl functionality greater than 2, said polymers selected from the group consisting of polyesters, polyethers, and epoxies.

4. The composition of claim 1 wherein the polymeric resin is formed by reacting a polyamine or polyamide with a lower molecular weight polyepoxide compound.

5. The composition of claim 1 wherein the functional groups of the polymeric resin are hydroxyl and the curing agent is a blocked polyisocyanate.

6. The composition of claim 1 wherein the functional groups of the polymeric resin are unsaturated double bonds and the curing agent is a free radical initiator.

7. The composition of claim 5 wherein the functional groups are acrylic.

8. The composition of claim 7 wherein the resin has acrylic functionality and the C-stage curing agent is a free radical initiator.

9. A solid adhesive composition which is thermosetting and can be activated upon application of sufficient heat or ultrasonic energy without thermosetting, said composition comprising:
   (a) a film forming polymeric resin having a hydroxyl functionality greater than about 2 and selected from the group of polyols consisting of a polyester resin, a polyurethane resin, a polyether resin, an epoxy resin, and combinations thereof, said resin having been reacted to the B-stage with a first curing agent which was present either in less than a stoichiometric quantity or was capable of reacting with functional groups that were present at concentrations of three or less on the polymer chain, said first curing agent being a polyisocyanate or polyisocyanurates and having been present in an amount sufficient to react with 10 to 60 percent of the hydroxyl groups to B-stage the polymeric resin sufficiently to provide the composition with non-blocking properties;
   (b) a second component comprised of at least one filler, or at least one polyfunctional compound containing a polyaromatic backbone and having an average molecular weight below about 7,000, or mixtures thereof the weight ratio of said first component to said second component being between about 1.5:1 and about 9:1; and
   (c) a second curing agent which is capable of initiating a reaction with the hydroxyl groups of the polymeric resin to form crosslinks and cure the polymeric resin to a C-stage upon application of sufficient energy in the form of heat or light, said second curing agent being non-reactive or blocked when the adhesive composition is activated;
   (d) said composition being flexible, and in the C-stage capable of forming an infusible composition which does not melt, flow or decompose when exposed for 10 seconds to molten solder at 288° C. and does not soften when exposed to dichloromethane at 25° C. for 10 seconds.

10. A non-blocking, solid adhesive composition which can be activated upon application of sufficient heat or ultrasonic energy without becoming C-staged which comprises:
   (a) a film forming epoxy resin which has been reacted to a B-stage polymer having an average molecular weight greater than about 30,000;
   (b) a polyfunctional resin having an average molecular weight below about 5,000 and containing a polyphenol backbone, the weight ratio of said first component to said second component being between about 1:1 and about 3:1; and
   (c) a curing agent which is capable of reacting or initiating a reaction with the functional groups of at least one of the resins to form crosslinks and cure the resin to a C-stage upon application of sufficient energy in the form of heat or radiant energy, said curing agent being non-reactive or blocked at the conditions which will activate the adhesive composition, said curing agent being present in an amount sufficient to C-stage at least one of the resins;
   said composition being flexible, and in the C-stage capable of forming an infusible composition which does not melt, flow or decompose when exposed for 10 seconds to molten solder at 260° C. and does not soften when exposed to dichloromethane at 25° C. for 10 seconds.

11. The composition of claim 10 wherein the polymeric resin is formed by reacting a polyamine or polyamide with a lower molecular weight polyepoxide compound.

* * * * *